(12) United States Patent
Yang et al.

(10) Patent No.: US 8,618,541 B2
(45) Date of Patent: Dec. 31, 2013

(54) SEMICONDUCTOR APPARATUS

(75) Inventors: Hyung Gyun Yang, Icheon-si (KR); Hyung Dong Lee, Icheon-si (KR); Yong Kee Kwon, Icheon-si (KR); Young Suk Moon, Icheon-si (KR); Sung Wook Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 27 days.

(21) Appl. No.: 13/341,299

(22) Filed: Dec. 30, 2011

(65) Prior Publication Data
US 2013/0092936 A1   Apr. 18, 2013

(30) Foreign Application Priority Data
Oct. 18, 2011   (KR) .................. 10-2011-0106159

(51) Int. Cl.
*H01L 23/58* (2006.01)
*G11C 29/00* (2006.01)

(52) U.S. Cl.
USPC .............. 257/48; 257/E23.001; 365/201

(58) Field of Classification Search
CPC ..... H01L 22/34; H01L 22/32; G01R 31/2884
USPC ....... 257/48, 529, E23.001; 365/191, 230.03, 365/201
See application file for complete search history.

(56) References Cited

U.S. PATENT DOCUMENTS

| 7,816,934 B2 | 10/2010 | Keeth |
| 2011/0110064 A1* | 5/2011 | Foster et al. .................. 361/803 |

* cited by examiner

*Primary Examiner* — Nikolay Yushin
(74) *Attorney, Agent, or Firm* — William Park & Associates Patent Ltd.

(57) ABSTRACT

A semiconductor apparatus includes first and second vias, a first circuit unit, a second circuit unit and a third circuit unit. The first and second vias electrically connect a first chip and a second chip with each other. The first circuit unit is disposed in the first chip, receives test data, and is connected with the first via. The second circuit unit is disposed in the first chip, and is connected with the second via and the first circuit unit. The third circuit unit is disposed in the second chip, and is connected with the first via. The first circuit unit outputs an output signal thereof to one of the first via and the second circuit unit in response to a first control signal.

20 Claims, 4 Drawing Sheets

SEMICONDUCTOR APPARATUS

CROSS-REFERENCES TO RELATED APPLICATION

The present application claims priority under 35 U.S.C. §119(a) to Korean application number 10-2011-0106159, filed on Oct. 18, 2011, in the Korean Intellectual Property Office, which is incorporated herein by reference in its entirety as set forth in full.

BACKGROUND

1. Technical Field

The present invention relates to a semiconductor apparatus, and more particularly, to a 3D (three-dimensional) semiconductor apparatus using through vias.

2. Related Art

In order to improve the degree of integration of a semiconductor apparatus a 3D (three-dimensional) semiconductor apparatus has been developed. The 3D semiconductor apparatus typically includes a plurality of chips that are stacked and packaged to increase the degree of integration. In the 3D semiconductor apparatus, since two or more chips are vertically stacked, a maximum degree of integration may be achieved in a same area.

Various methods may be applied to realize the 3D semiconductor apparatus. In one of the methods, a plurality of chips having a same structure are stacked and then the plurality of chips are connected with one another using wires such as metal lines so that the plurality of chips operate as one semiconductor apparatus.

Recently, a TSV (through-silicon via) type semiconductor apparatus has been disclosed in the art, in which through-silicon vias are formed to pass through a plurality of stacked chips so that all the chips are electrically connected with one another. In the TSV type semiconductor apparatus, because the through-silicon vias vertically pass through respective chips to electrically connect the respective chips with one another, the area of a package may be efficiently reduced when compared to a semiconductor apparatus in which respective chips are connected with one another through peripheral wiring.

TSVs are formed by filling a conductive material in via holes which are defined through a dielectric substance. Since the semiconductor apparatus may operate normally only when the TSVs are properly formed, a scan test is performed in a manufacturing process to determine whether or not TSVs properly connect the plurality of chips.

FIG. 1 is a view schematically showing a conventional scan test method of a semiconductor apparatus. In FIG. 1, a semiconductor apparatus includes first to third chips CHIP1, CHIP2 and CHIP3. The first to third chips CHIP1, CHIP2 and CHIP3 are electrically connected with one another through first to eighth TSVs TSV1 to TSV8. The first and second chips CHIP1 and CHIP2 are connected with each other through the first to fourth TSVs TSV1 to TSV4, and the second and third chips CHIP2 and CHIP3 are connected with each other through fifth to eighth TSVs TSV5 to TSV8. The test of the TSVs is performed as follows. First, test data TDATA is applied to the first TSV TSV1. The test data TDATA may be a predetermined voltage or current. The test data TDATA applied to the first TSV TSV1 is transmitted sequentially through the first to eighth TSVs TSV1 to TSV8 as shown in FIG. 1, and finally, a test output signal TOUT may be outputted through the fourth TSV TSV4. Therefore, by measuring the current or voltage of the output signal which is outputted through the fourth TSV TSV4, it is possible determined whether or not the TSVs included in the semiconductor apparatus are appropriately connected with one another.

SUMMARY

A semiconductor apparatus which can form scan test paths in a variety of ways is described herein.

In one embodiment of the present invention, a semiconductor apparatus includes: first and second vias electrically connecting a first chip and a second chip with each other; a first circuit unit disposed in the first chip, configured to receive test data, and connected with the first via; a second circuit unit disposed in the first chip, and connected with the second via and the first circuit unit; a third circuit unit disposed in the second chip, and connected with the first via, wherein the first circuit unit outputs an output signal thereof to one of the first via and the second circuit unit in response to a first control signal.

In another embodiment of the present invention, a semiconductor apparatus includes: a scan circuit block including a receiving section configured to generate an output signal from one of an output signal of another circuit unit which is disposed in a first chip and an output signal of a circuit unit which is disposed in a second chip, in response to a second control signal; and an output section configured to output the output signal of the receiving section to one of still another circuit unit which is disposed in the first chip and a circuit unit which is disposed in a third chip, in response to a first control signal, wherein the scan circuit block is disposed in the first chip.

A semiconductor apparatus comprising a first via electrically connecting a first chip and a second chip; a first circuit unit disposed in the first chip and connected with the first via; a second circuit unit disposed in the first chip; and wherein the first circuit unit outputs an output signal to one of the first via and the second circuit unit in response to a first control signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to embodiment of the present invention will be described below with reference to the accompanying drawings through exemplary embodiments.

Figure 2:
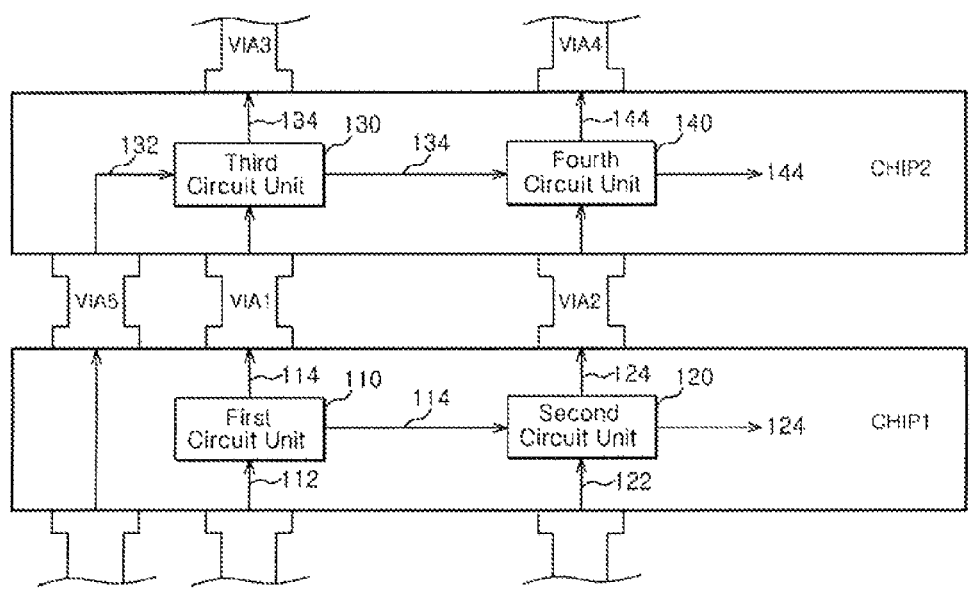
FIG. 2 is a view schematically showing a configuration of a semiconductor apparatus in accordance with an embodiment of the present invention.

FIG. 2 is a view schematically showing a configuration of a semiconductor apparatus in accordance with an embodiment of the present invention. In FIG. 2, while a semiconductor apparatus 1 is exemplified as including two chips, it is to be noted that the number of stacked chips is not specifically limited. First and second chips CHIP1 and CHIP2 are stacked and constitute a single semiconductor apparatus 1. The first and second chips CHIP1 and CHIP2 may be electrically connected with each other by first and second through vias VIA1 and VIA2.

The semiconductor apparatus 1 includes first to fourth circuit units 110, 120, 130 and 140. The first and second circuit units 110 and 120 are disposed in the first chip CHIP1, and the third and fourth circuit units 130 and 140 are disposed in the second chip CHIP2. The first and second circuit units 110 and 120 may receive test data. The first and second circuit units 110 and 120 may receive the test data from a chip (for example, a logic die) (not shown) which is stacked under the first chip CHIP1, or the first and second circuit units 110 and 120 may receive test data from a test control unit. Detailed descriptions will be given later.

The first circuit unit 110 is connected with the third circuit unit 130 through the first through via VIA1. The second circuit unit 120 is connected with the first circuit unit 110, and the second circuit unit 120 is also connected with the fourth circuit unit 140 through the second through via VIA2. The third circuit unit 130 is connected with the first circuit unit 110 through the first through via VIA1, and the third circuit unit 130 is also connected with the fourth circuit unit 140. Also, the third circuit unit 130 may be connected, through a third through via VIA3, with a circuit unit which is disposed in another chip (not shown) stacked over the second chip CHIP2. The fourth circuit unit 140 is connected with the third circuit unit 130, and the fourth circuit unit 140 is also connected with the second circuit unit 120 through the second through via VIA2. Also, the fourth circuit unit 140 may be connected, through a fourth through via VIA4, with another circuit unit which is disposed in the chip stacked over the second chip CHIP2.

The first circuit unit 110 is configured to receive an input signal 112 and generate an output signal 114. The input signal 112 may be test data. The first circuit unit 110 outputs the output signal 114 thereof to one of the second circuit unit 120 and the first through via VIA1 in response to a first control signal.

The second circuit unit 120 is configured to receive the output signal 114 of the first circuit unit 110 and generate an output signal 124. The second circuit unit 120 outputs the output signal 124 thereof to one of the second through via VIA2 and another circuit unit (not shown) disposed in the first chip CHIP1, in response to the first control signal. Also, the second circuit unit 120 may output the output signal 124 thereof to the test control unit in response to an output enable signal. The second circuit unit 120 may receive one of the output signal 114 of the first circuit unit 110 and an input signal 122 in response to a second control signal. The input signal 122 may be test data.

The third circuit unit 130 is configured to receive the output signal 114 of the first circuit unit 110 through the first through via VIA1 and generate an output signal 134. The third circuit unit 130 outputs the output signal 134 thereof to one of the fourth circuit unit 140 and the third through via VIA3 in response to the first control signal. The third circuit unit 130 may receive an input signal 132 in response to a third control signal, instead of receiving the output signal 114 of the first circuit unit 110 through the first through via VIA1. The input signal 132 may be test data. The semiconductor apparatus 1 may further include a fifth through via VIA5 which electrically connect the first and second chips CHIP1 and CHIP2 with each other. The third circuit unit 130 may receive the input signal 132 through the fifth through via VIA5. Otherwise, the third circuit unit 130 may receive the input signal 132 through the test control unit which is disposed in the second chip CHIP2. Detailed descriptions will be given later.

The fourth circuit unit 140 is configured to receive the output signal 124 of the second circuit unit 120 through the second through via VIA2 or the output signal 134 of the third circuit unit 130 in response to the second control signal, and generate an output signal 144 thereof. The fourth circuit unit 140 outputs the output signal 144 thereof to one of the fourth through via VIA4 or another circuit unit which is disposed in the second chip CHIP2, in response to the first control signal. Further, the fourth circuit unit 140 may output the output signal 144 thereof to the test control unit in response to the output enable signal.

The test control unit may be disposed in another chip which is stacked with respect to the first and second chips CHIP1 and CHIP2. In this case, the test control unit may transmit test data and/or control signals necessary for testing, to the first to fourth circuit units 110, 120, 130 and 140 through through vias. Moreover, test control units may be respectively disposed in the first and second chips CHIP1 and CHIP2. When the test control units are respectively disposed in the first and second chips CHIP1 and CHIP2, the semiconductor apparatus 1 may be configured to not include the fifth through via VIA5.

The second and fourth circuit units 120 and 140 may output their respective output signals 124 and 144 to the test control unit. That is to say, the second and fourth circuit units 120 and 140 may output their respective output signals 124 and 144 to circuit units connected thereto or to the test control unit. Through the configuration as described above, the semiconductor apparatus in accordance with an embodiment of the present invention may have various scan test paths.

Figure 3:
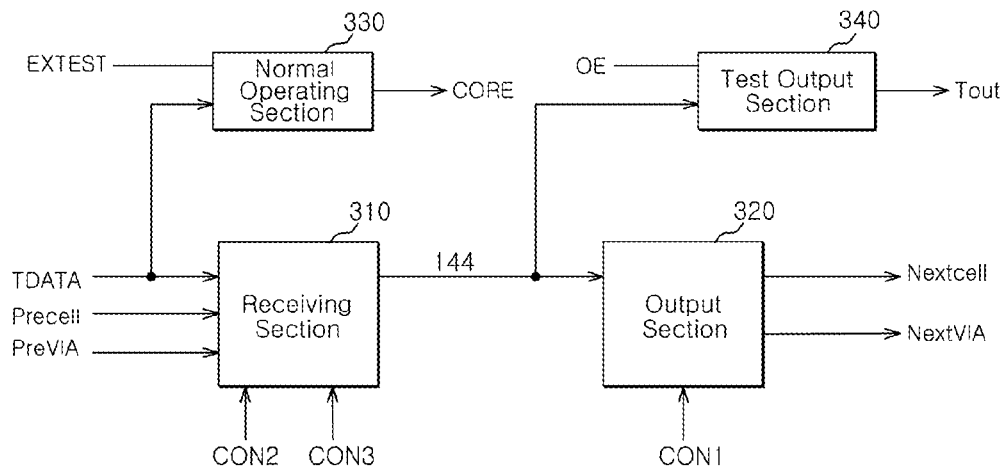
FIG. 3 is a block diagram schematically showing a configuration of an exemplary embodiment of the fourth circuit unit shown in FIG. 2.

FIG. 3 is a block diagram schematically showing a configuration of an example embodiment of the fourth circuit unit shown in FIG. 2. In FIG. 3, the fourth circuit unit 140 includes a receiving section 310 and an outputting section 320. The receiving section 310 may receive an output signal Precell which is outputted from a circuit unit of a previous stage disposed in the same chip as the first circuit unit 140 or receive an output signal PreVIA outputted from a circuit unit dis posed in an other chip which is different from the chip of the fourth circuit unit 140 where the other chip is connected with the chip of the fourth circuit unit 140 through a through via. The receiving section 310 may receive the output that may be sent in response to a second control signal CON2. The receiving section 310 is configured to receive one of the output signal Precell of the circuit unit of the previous stage and the output signal PreVIA of the circuit unit of another chip, and generate the output signal 144. In other words, as can be readily seen from FIG. 2, the receiving section 310 receives the output signal 134 of the third circuit unit 130 or receives the output signal 124 of the second circuit unit 120 through the second through via VIA2, and generates the output signal 144 of the fourth circuit unit 140. Also, the receiving section 310 receives test data TDATA sent in response to a third control signal CON3 and generates the output signal 144 of the fourth circuit unit 140. Namely, the receiving section 310 may not receive the output signal Precell of the circuit unit of the previous stage and the output signal PreVIA transmitted through the through via in response to the third control signal CON3, and may generate the output signal 144 of the fourth circuit unit 140 from the test data TDATA. The receiving section 310 may be realized by a register circuit, and may be configured in a variety of ways, for example, to include a MUX and/or a flip-flop.

The output section 320 may output the output signal 144 of the fourth circuit unit 140 to another circuit unit Nextcell which is disposed in the same chip or to another circuit unit NextVIA which is disposed in another chip and is connected with the output section 320 through a through via. The output section 320 may output the output signal 144 in response to a first control signal CON1. The output section 320 may also be realized by a register circuit, and may be configured in a variety of ways, for example, to include a MUX and/or a flip-flop.

In FIG. 3, the fourth circuit unit 140 may further include a normal operating section 330. The normal operating section 330 may output the signal inputted through a pin to which the test data TDATA is inputted, to a core circuit CORE in response to a test control signal EXTEST. It is inefficient that the semiconductor apparatus 1 has a separate pin dedicated for receiving only the test data TDATA, for a test operation. Thus, the test data TDATA may be inputted through a pin which has been already provided to receive a signal necessary for a normal operation of the semiconductor apparatus. The semiconductor apparatus 1 may receive the test data TDATA through the pin in the test operation and may receive the signal necessary for the normal operation, through the pin in the normal operation. The normal operating section 330 may output the signal inputted through the pin, selectively to the core circuit CORE in response to the test control signal EXTEST indicating whether the semiconductor apparatus 1 performs a test operation.

In FIG. 3, the fourth circuit unit 140 further includes a test output section 340. The test output section 340 outputs the output signal 144 of the fourth circuit unit 140 to the test control unit as a test output signal TOUT in response to an output enable signal OE.

The first to third circuit units 110 to 130 of FIG. 2 may have the same configuration as the fourth circuit unit 140. Therefore, the first to fourth circuit units 110 to 140 may receive input signals selectively from circuit units of previous stages disposed in the same chips, through vias connected with other chips and the test control unit. Furthermore, the first to fourth circuit units 110 to 140 may output output signals selectively to circuit units of previous stages disposed in the same chips, through vias connected with other chips and the test control unit. Accordingly, the semiconductor apparatus may form various scan test paths using, in one embodiment, the circuit units 110 to 140.

Figure 4:
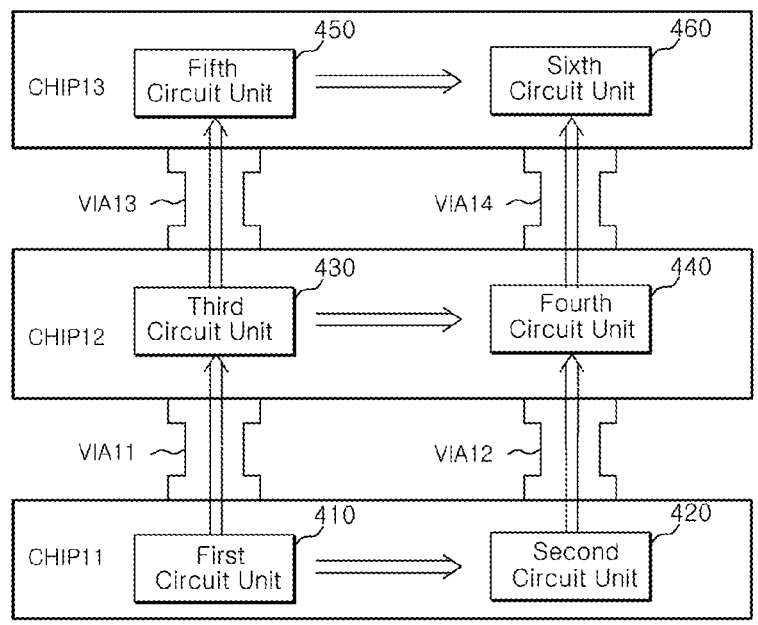
FIG. 4 is a view schematically showing a semiconductor apparatus in accordance with another embodiment of the present invention, illustrating various test paths.

FIG. 4 is a view schematically showing a semiconductor apparatus in accordance with another embodiment of the present invention, illustrating various test paths. In FIG. 4, in order to explain various test paths in detail, it is illustrated that first to third chips CHIP11, CHIP12 and CHIP13 are stacked to constitute a single semiconductor apparatus. The first chip CHIP11 includes first and second circuit units 410 and 420, the second chip CHIP12 includes third and fourth circuit units 430 and 440, and the third chip CHIP13 includes fifth and sixth circuit units 450 and 460. The first to sixth circuit units 410, 420, 430, 440, 450 and 460 may receive outputs of circuit units of previous stages which are disposed in the same chips or may receive outputs of circuit units which are disposed in other chips, where the outputs received from other chips are received through through vias. Also, the first to sixth circuit units 410, 420, 430, 440, 450 and 460 may output the output signals thereof to circuit units of next stages which are disposed in the same chips or may output the output signals thereof to circuit units which are disposed in other chips, where the outputs sent to other chips are sent through through vias. In addition, the first to sixth circuit units 410, 420, 430, 440, 450 and 460 may output the output signals thereof to a test control unit.

Figure 1:
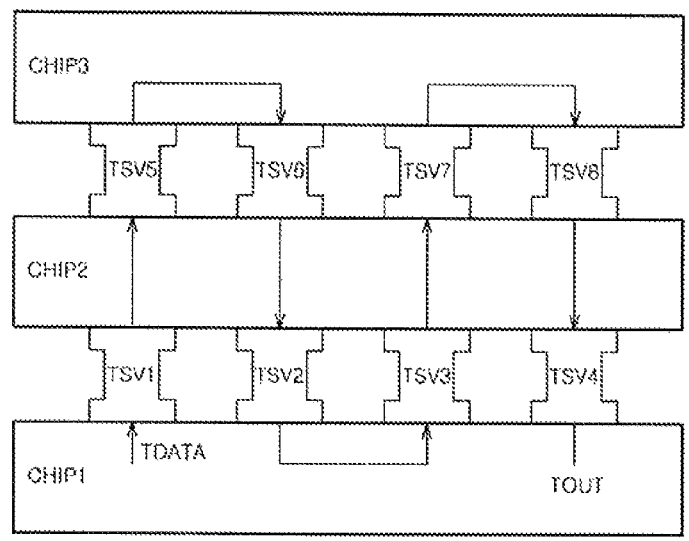
FIG. 1 is a view schematically showing a configuration of a semiconductor apparatus and a scan test method according to the conventional art.

A semiconductor apparatus 2 may form various test paths by including the first to sixth circuit units 410, 420, 430, 440, 450 and 460. In a semiconductor apparatus according to the conventional art, when a fail occurs in a first through via VIA11, second to fourth through vias VIA12 to VIA14 may not be tested for occurrence of a fail. That is to say, in the conventional semiconductor apparatus, since a single test path is formed as shown in FIG. 1, when a fail occurs in the first through via VIA11, a test result cannot be obtained concerning whether or not a failure occurred in the second to fourth through vias VIA12 to VIA14. Further, occurrence of a fail in the second to fourth through vias VIA12 to VIA14 may not be tested if a failure occurs in the first through via VIA11. However, in the semiconductor apparatus 2, whether or not a fail occurs in the second to fourth through vias VIA12 to VIA14 may be checked even when a fail occurs in the first through via VIA11. For example, if a fail occurs in the first through via VIA11, the second circuit unit 420 may possibly not receive the output signal of the first circuit unit 410 and may receive test data and generate an output signal. In addition, by outputting the output signal of the second circuit unit 420 through the second through via VIA12 to the fourth circuit unit 440, it is possible to test whether or not a fail occurs in the second through via VIA12. Similarly, the third circuit unit 430 may possibly not receive the output signal of the first circuit unit 410 and may receive the test data and generate an output signal. Besides, by outputting the output signal of the third circuit unit 430 to the fifth circuit unit 450 through the third through via VIA13, it is possible to test whether or not a fail occurs in the third through via VIA13.

The third circuit unit 430 may output the output signal thereof to the fourth circuit unit 440, and the fourth circuit unit 440 may output the output signal thereof to the sixth circuit unit 460 through the fourth through via VIA14 and test whether or not a fail occurs in the fourth through via VIA14. Because the semiconductor apparatus 2 has a plurality of circuit units which are connected with one another in the same chips so test paths may be formed to sequentially pass through the plurality of circuit units, it is possible to form various test paths. For example, a test path extending from the first circuit unit 410 to the second circuit unit 420 may be formed, a test path extending from the first circuit unit 410 through the first through via VIA11 to the third and/or fourth circuit unit 430 and/or 440 may be formed, and a test path extending from the first circuit unit 410 through the first through via VIA11, the third circuit unit 430 and the third through via VIA13 to the fifth and/or sixth circuit unit 450 and/or 460 may be formed. Also, a test path extending from the first circuit unit 410 through the first through via VIA11, the third circuit unit 430, the fourth circuit unit 440 and the fourth through via VIA14 to the sixth circuit unit 460 may be formed. Therefore, the semiconductor apparatus 2 may form test paths in the horizontal directions indicated by solid lines and may form test paths in the vertical directions indicated by dotted lines. Hence, by forming various test paths, a test may be performed for all through vias included in the semiconductor apparatus 2. Further, since test paths may be formed by detouring a failed through via, a precise and reliable test may be performed.

Figure 5:
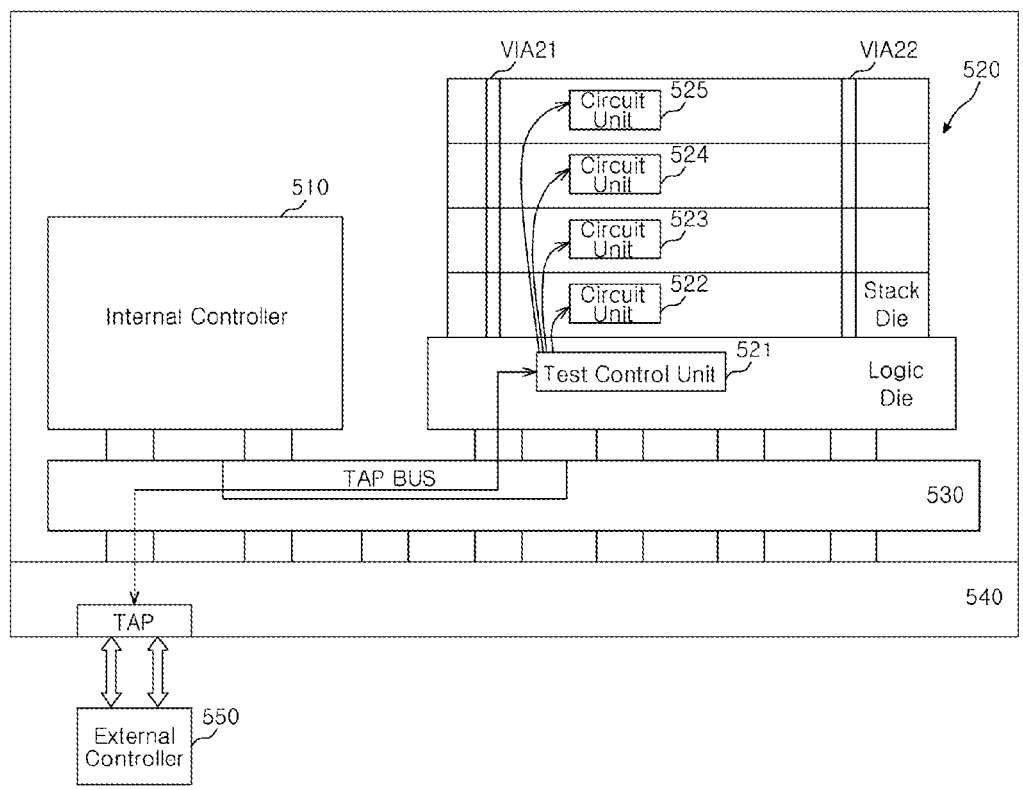
FIG. 5 is a view schematically illustrating a configuration of a system-in-package in accordance with another embodiment of the present invention.

FIG. 5 is a view schematically illustrating a configuration of a system-in-package in accordance with another embodiment of the present invention. In FIG. 5, a system-in-package 3 includes an internal controller 510, a semiconductor apparatus 520, an interposer 530, and a package substrate 540. The interposer 530 includes channels for communication between an external controller 550 and the internal controller 510, communication between the internal controller 510 and the semiconductor apparatus 520, and communication between the external controller 550 and the semiconductor apparatus 520. In FIG. 5, the semiconductor apparatus 520 includes a logic die Logic Die and stack dies Stack Die which are connected through through vias VIA21 and VIA22. A test control unit 521 is disposed in the logic die Logic Die. Test data and/or control signals for testing may be inputted from the external controller 550 through a tap TAP to the system-in-package 3, and the signals may be transmitted to the test control unit 521 through a tap bus TAP BUS which is formed in the interposer 530. The test control unit 521 may provide the test data and/or the control signals to circuit units 522 to 525 which are disposed in the stack dies Stack Die. Accordingly, as described above with reference to FIGS. 2 to 4, a test of the semiconductor apparatus 520 may be performed. Furthermore, the test control unit 521 may receive test output signals which are outputted from the circuit units 522 to 525 and output the test output signals to the external controller 550 through the tap TAP. Thus, a test result may be checked outside. The test control unit 520 includes, for example, but is not limited to, IEEE 1149.1 used as a standard interface circuit.

Figure 6:
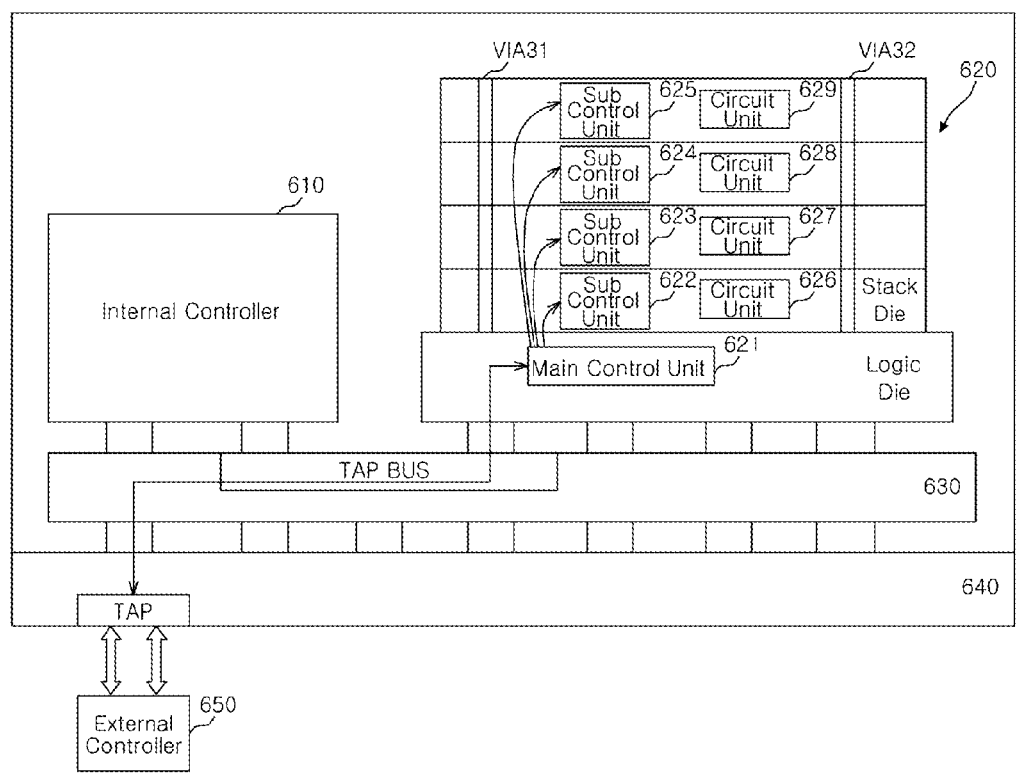
FIG. 6 is a view schematically illustrating a configuration of a system-in-package in accordance with another embodiment of the present invention.

FIG. 6 is a view schematically illustrating the configuration of a system-in-package in accordance with another embodiment of the present invention. In FIG. 6, a system-in-package 4 includes a main control unit 621 and sub control units 622 to 625, unlike the test control unit 521 shown in FIG. 5. The main control unit 621 is configured to communicate with an external controller 650 and control the sub control units 622 to 625. The sub control units 622 to 625 are disposed in respective stack dies Stack Die and provide control signals for testing circuit units 626 to 629 disposed in the stack dies Stack Die. The main control unit 621 includes, for example, but is not limited to, IEEE 1149.1, and the sub control units 622 to 625 may include IEEE 1500.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should read in light of the claims that follow when taken in conjunction with the above description and accompanying drawings.

What is claimed is:

1. A semiconductor apparatus comprising:
   first and second vias electrically connecting a first chip and a second chip with each other;
   a first circuit unit disposed in the first chip, configured to receive test data to generate an output signal, and connected with the first via;
   a second circuit unit disposed in the first chip, and connected with the second via and the first circuit unit;
   a third circuit unit disposed in the second chip, and connected with the first via,
   wherein the first circuit unit outputs the output signal thereof to one of the first via and the second circuit unit in response to a first control signal, and the third circuit unit receives the output signal of the first circuit unit through the first via.

2. The semiconductor apparatus according to claim 1, wherein the second circuit unit receives the output signal of the first circuit unit to generate an output signal and outputs the output signal thereof to the second via in response to the first control signal.

3. The semiconductor apparatus according to claim 2, wherein the second circuit unit receives the test data instead of the output signal of the first circuit unit in response to a second control signal and generates an output signal thereof.

4. The semiconductor apparatus according to claim 3, wherein the third circuit unit receives the output signal of the first circuit unit through the first via in response to the second control signal and generates an output signal thereof.

5. The semiconductor apparatus according to claim 1, further comprising:
   a fourth circuit unit disposed in the second chip, and connected with the second via and the third circuit unit,
   wherein the third circuit unit outputs the output signal thereof to one of the fourth circuit unit and a third via which connects the second chip with another chip stacked over the second chip, in response to the first control signal.

6. The semiconductor apparatus according to claim 5, wherein the fourth circuit unit receives one of the output signal of the second circuit unit, which is transmitted through the second via, and the output signal of the third circuit unit in response to the second control signal, and generates an output signal thereof.

7. The semiconductor apparatus according to claim 6, wherein the fourth circuit unit outputs the output signal thereof to a fourth via which connects the second chip with the another chip, in response to the first control signal.

8. The semiconductor apparatus according to claim 1, further comprising:
   a fifth via electrically connecting the first and second chips with each other and configured to transmit the test data,
   wherein the third circuit unit receives the test data through the fifth via in response to a third control signal.

9. A semiconductor apparatus comprising:
   a scan circuit block including
   a receiving section configured to generate an output signal from one of an output signal of another circuit unit which is disposed in a first chip and an output signal of a circuit unit which is disposed in a second chip, in response to a second control signal; and
   an output section configured to output the output signal of the receiving section to one of still another circuit unit which is disposed in the first chip and a circuit unit which is disposed in a third chip, in response to a first control signal,
   wherein the scan circuit block is disposed in the first chip.

10. The semiconductor apparatus according to claim 9, wherein the receiving section receives test data instead of the output signals of the another circuit unit which is disposed in the first chip and of the circuit unit which is disposed in the second chip, in response to a third control signal.

11. The semiconductor apparatus according to claim 10, wherein the scan circuit block further comprises:
   a normal operating section configured to transmit input of the test data to a core circuit in response to a test control signal which divides a test operation and a normal operation of the semiconductor apparatus.

12. The semiconductor apparatus according to claim 11, wherein the scan circuit block further comprises:
   a test control section configured to communicate with an external controller and provide the first to third control signals, the test data and the test control signal.

13. The semiconductor apparatus according to claim 12, wherein the scan circuit block further comprises:

a test output section configured to output the output signal of the receiving section to the test control section in response to an output enable signal.

14. The semiconductor apparatus according to claim 9, wherein the scan circuit block is electrically connected with the circuit unit which is disposed in the second chip, through a via, and the output signal of the circuit unit disposed in the second chip, which is received by the scan circuit block, has information as to whether a fail has occurred in the via.

15. The semiconductor apparatus according to claim 9, wherein the scan circuit block is electrically connected with the circuit unit which is disposed in the third chip, through a via, and an output of the scan circuit block, which is received by the circuit unit disposed in the third chip, has information as to whether a fail has occurred in the via.

16. A semiconductor apparatus comprising: a first via electrically connecting a first chip and a second chip; a first circuit unit disposed in the first chip, configured to receive test data to generate an output signal, and connected with the first via; a second circuit unit disposed in the first chip; and wherein the first circuit unit outputs the output signal to one of the first via and the second circuit unit in response to a first control signal, and a third circuit unit receives the output signal of the first circuit unit through the first via.

17. The semiconductor apparatus according to claim 16, wherein the second circuit unit outputs an output signal in response to receiving the output signal of the first circuit unit, where the second circuit unit outputs the output signal to a second via that is connected to the second circuit unit and which electrically connects the first and the second chip.

18. The semiconductor apparatus according to claim 17, wherein the second circuit unit receives test data instead of the output signal of the first circuit unit, where the test data is sent in response to a second control signal.

19. The semiconductor apparatus according to claim 18, wherein the third circuit unit is disposed in the second chip, and connected with the first via, wherein the third circuit unit receives the output signal of the first circuit unit through the first via in response to the second control signal and generates an output signal.

20. The semiconductor apparatus according to claim 19, further comprising:
a fourth circuit unit disposed in the second chip, and connected with the second via and the third circuit unit,
wherein the third circuit unit outputs an output signal thereof to one of the fourth circuit unit and a third via which connects the second chip with another chip stacked over the second chip, in response to the first control signal.

* * * * *